(12) United States Patent
Bakeman, Jr.

(10) Patent No.: US 7,482,254 B2
(45) Date of Patent: Jan. 27, 2009

(54) APPARATUS AND METHODS FOR THERMALLY PROCESSING UNDOPED AND LIGHTLY DOPED SUBSTRATES WITHOUT PRE-HEATING

(75) Inventor: Paul E. Bakeman, Jr., Shelburne, VT (US)

(73) Assignee: Ultratech, Inc., San Jose, CA (US)

( * ) Notice: Subject to any disclaimer, the term of this patent is extended or adjusted under 35 U.S.C. 154(b) by 322 days.

(21) Appl. No.: 11/236,270

(22) Filed: Sep. 26, 2005

(65) Prior Publication Data

US 2007/0072400 A1 Mar. 29, 2007

(51) Int. Cl.
*H01L 21/425* (2006.01)

(52) U.S. Cl. ............... 438/528; 438/795; 257/E21.328; 257/31.001

(58) Field of Classification Search .......... 438/308, 438/522, 795, 378, 528; 257/E21.211, E21.328, 257/E21.471, E31.001
See application file for complete search history.

(56) References Cited

U.S. PATENT DOCUMENTS

| | | | |
|---|---|---|---|
| 6,747,245 B2 | 6/2004 | Talwar et al. | 219/121.8 |
| 2004/0173585 A1 | 9/2004 | Talwar et al. | 219/121.63 |
| 2004/0188396 A1 | 9/2004 | Talwar et al. | 219/121.65 |
| 2005/0067384 A1 | 3/2005 | Talwar et al. | 219/121.6 |
| 2005/0103998 A1 | 5/2005 | Talwar et al. | 250/340 |
| 2006/0234458 A1 | 10/2006 | Jennings et al. | 438/308 |
| 2006/0260545 A1* | 11/2006 | Ramaswamy et al. | 118/719 |

* cited by examiner

*Primary Examiner*—Quoc D Hoang
(74) *Attorney, Agent, or Firm*—Allston L. Jones (57) ABSTRACT

Apparatus for and methods of thermally processing undoped or lightly doped semiconductor wafers (30) that typically are not very absorptive of an annealing radiation beam (14) are disclosed. The apparatus (10) uses a relatively low power activating radiation beam (240) with a photon energy greater than the bandgap energy of the semiconductor substrate in order to generate free carriers (315) at and near the substrate surface (32). The free carriers so generated enhance the absorption by the substrate surface of the longer wavelength annealing radiation beam. The annealing radiation beam is thus able to rapidly heat the substrate surface and permit subsequent rapid cooling to obtain, for example, a high level of electrical activity (activation) of dopants (310) formed therein. The invention obviates the need to pre-heat the substrate in order to increase absorption of the annealing radiation beam when performing thermal processing.

24 Claims, 6 Drawing Sheets

APPARATUS AND METHODS FOR THERMALLY PROCESSING UNDOPED AND LIGHTLY DOPED SUBSTRATES WITHOUT PRE-HEATING

CROSS-REFERENCE TO RELATED APPLICATIONS

The present invention is related to U.S. Pat. No. 6,747,245, entitled "Laser Scanning Apparatus and Method for Thermal Processing", U.S. patent application Ser. No. 10/787,664 entitled "Laser Scanning Apparatus and Methods for Thermal Processing" filed on Feb. 26, 2004, U.S. patent application Ser. No. 10/806,014, entitled "Laser Scanning Apparatus and Methods for Thermal Processing" filed on Mar. 22, 2004 and published as U.S patent application Ser. No. 2004/0173585 on Sep. 9, 2004, U.S. patent application Ser. No. 10/674,106 entitled "Method of Annealing Undoped Silicon Substrates" filed on Sep. 29, 2003 and U.S. patent application Ser. No. 10/762,861 entitled "Laser Thermal Annealing of Lightly Doped Silicon Substrates" filed on Jan. 22, 2004, all of which are assigned to the present Assignee Ultratech, Inc. of San Jose, Calif., and all of which are incorporated by reference herein.

BACKGROUND OF THE INVENTION

1. Field of the Invention

The present invention relates to thermal processing of substrates, and in particular relates to laser thermal processing of substrates to activate doped regions formed therein in the manufacture of semiconductor devices such as integrated circuits (ICs).

2. Description of the Prior Art

Thermal processing (TP) (also referred to as laser thermal processing or LTP, and laser thermal annealing or LTA) is a technique for rapidly annealing source/drain diffusions formed in silicon wafers as part of the process for fabricating semiconductor devices such as integrated circuits (ICs). The principle objective of thermal processing is to produce shallow doped regions with very high conductivity by rapidly heating the wafer to temperatures near the semiconductor melting point in order to incorporate implanted atoms (dopants) at substitutional lattice sites, and then rapidly cool the wafer to "freeze" the dopants in place. This results in low-resistivity doped regions, which translates into faster ICs. It also results in an abrupt change in dopant atom concentration with depth as defined by the implant process, since thermal diffusion plays only a very minor role in the rearrangement of the impurity atoms in the lattice structure. This also serves to improve the electrical characteristics of the resulting transistors.

Conventional laser thermal processing utilizes a high power $CO_2$ laser beam (the "annealing beam"), which is raster scanned over the wafer surface such that all regions of the surface are exposed to at least one pass of the annealing beam. The wavelength of the $CO_2$ laser is in the infrared region at $\lambda=10.6$ μm. This wavelength, combined with the incidence angle and the polarization of the beam, serves to provide a very uniform absorption across the wafer and results in each point on the wafer being subject to very nearly the same maximum temperature. The long wavelength of the beam and the shallow angle of incidence combine to minimize diffraction effects from the pre-existing structures on the wafer further improving the processing temperature uniformity.

This heating-uniformity advantage is accompanied by a disadvantage in that lightly-doped, high-resistivity, silicon wafers do not significantly absorb the 10.6 μm wavelength of the annealing beam and so are not significantly heated. This is because the photon energy of the 10.6 μm radiation is less than the semiconductor (silicon) bandgap energy.

One approach to overcoming the failure to couple the beam with the substrate during thermal processing is to pre-heat the wafer to a temperature where the equilibrium density of electrons and/or holes in the undoped/lightly-doped regions is sufficient to cause absorption of a significant fraction of incident annealing radiation.

The wafer pre-heat temperature needed to achieve the necessary free carrier concentration in silicon to cause substantial annealing radiation beam absorption near the wafer surface is approximately 400° C. Consequently, the wafer pre-heat method for performing thermal processing involves pre-heating the entire Wafer to approximately 400° C. by placing it on a heated vacuum chuck prior to scanning the annealing radiation beam over the wafer surface. While effective, this technique necessarily involves maintaining the entire wafer at the chuck temperature except for the small area beneath the annealing radiation beam. This is problematic because the resistivity of activated highly doped regions of the wafer slowly increases when subjected to an elevated temperature after these regions are annealed. In particular, subjecting a silicon semiconductor process wafer to a temperature of 400° C. for one minute is sufficient to produce an undesirable increase in resistivity. Thus, in practice, the resistivity of the last-scanned junctions is lower than that of the first-scanned junctions, resulting in an undesirable across-wafer variation in resistivity.

Another drawback of maintaining the wafer at a high background temperature during thermal processing is that none of the junctions on the wafer are quenched to a sufficiently low temperature (e.g., room temperature) where the interstitial dopant is frozen in the silicon lattice in a manner that achieves maximum conductivity.

An approach to performing thermal processing in a manner that eliminates the need to maintain the wafer at a relatively high background temperature has been proposed. The approach involves scanning a high powered pre-heating radiation beam from an LED array ahead of the annealing radiation beam to pre-heat a region of the wafer to approximately 400° C. or higher immediately prior to the arrival of the annealing radiation beam. While this approach removes the need for 400° C. background heating, the power and position of the pre-heating radiation beam relative to the annealing radiation beam needs to be accurately controlled and their relative positions switched when the scanning direction is switched. Accordingly, a relatively complex system is needed to switch the pre-heating radiation beam from one side of the annealing radiation beam to the other as the scan direction is reversed. Further, the alignment of the pre-heating radiation beam relative to the annealing radiation beam is fairly critical because the time constant for cooling the heated surface is relatively short.

SUMMARY OF THE INVENTION

An aspect of the invention is a method of thermally processing a semiconductor substrate having a surface and a semiconductor bandgap energy. The method includes irradiating the substrate with an activating radiation beam having photons with an energy greater than the semiconductor bandgap energy to generate free carriers in the substrate without substantially heating the substrate, to increase an amount of absorption of an annealing radiation beam. The method also includes irradiating the substrate with the annealing radiation having photons with an energy less than the semiconductor band gap energy and which are absorbed by the free carriers to substantially heat the substrate.

Another aspect of the invention is an apparatus for thermally annealing a semiconductor substrate having a surface, a region to be thermally transformed, and a semiconductor bandgap. The apparatus includes an activating radiation beam unit adapted to form an activating radiation beam having a photon energy greater than the semiconductor bandgap energy to generate free carriers in the substrate without substantially heating the substrate to increase an amount of absorption of an annealing radiation beam. The apparatus also includes an annealing radiation beam unit adapted to form an annealing radiation beam having a photon energy less than the semiconductor bandgap energy that is absorbed by the free carriers to heat the substrate to a temperature sufficient to thermally transform the region. The region to be thermally transformed may include, for example, a doped region of the substrate that requires dopant activation, an amorphous silicon layer to be transformed to a polysilicon layer, or a cobalt or nickel layer to be transformed to a silicide layer.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

X-Y-Z Cartesian coordinates are shown in the Figures for reference.

DETAILED DESCRIPTION OF THE INVENTION

The present invention uses a relatively low-power, short-wavelength activation radiation beam concurrently with a relatively high-power, long-wavelength annealing radiation beam to process a semiconductor substrate. The short-wavelength activation beam has a photon energy greater than the semiconductor bandgap of the semiconductor substrate so that its absorption in the top surface of the substrate creates sufficient free carriers to absorb the longer-wavelength, annealing radiation beam. The annealing beam provides most of the energy required to generate a temperature high enough to process the substrate such as activating doped regions in the substrate. In the specific case of a 10.6 micron annealing beam operating on a silicon substrate, once the substrate surface reaches 400° C. or 500° C., the thermal generation of charge carriers is sufficient to absorb the long-wavelength radiation and short-wavelength activation is no longer required.

This approach obviates the need to pre-heat the substrate prior to the arrival of the annealing radiation beam in order to increase absorption of the annealing radiation beam. The background temperature of the substrate can thus be any convenient value, and, in a junction annealing application, preferably one low enough that the interstitial dopants remain frozen in the silicon lattice on cooling. Not only does this achieve minimum resistivity of the activated doped regions, it also assures that that variation in resistivity is minimized across the wafer.

In the description below, an example embodiment of a thermal processing apparatus for practicing the invention is first described, followed by the method of operation of the apparatus for annealing doped regions in a semiconductor substrate without the need to pre-heat the substrate in order to increase absorption of the annealing radiation beam.

Thermal Processing Apparatus

Figure 1:
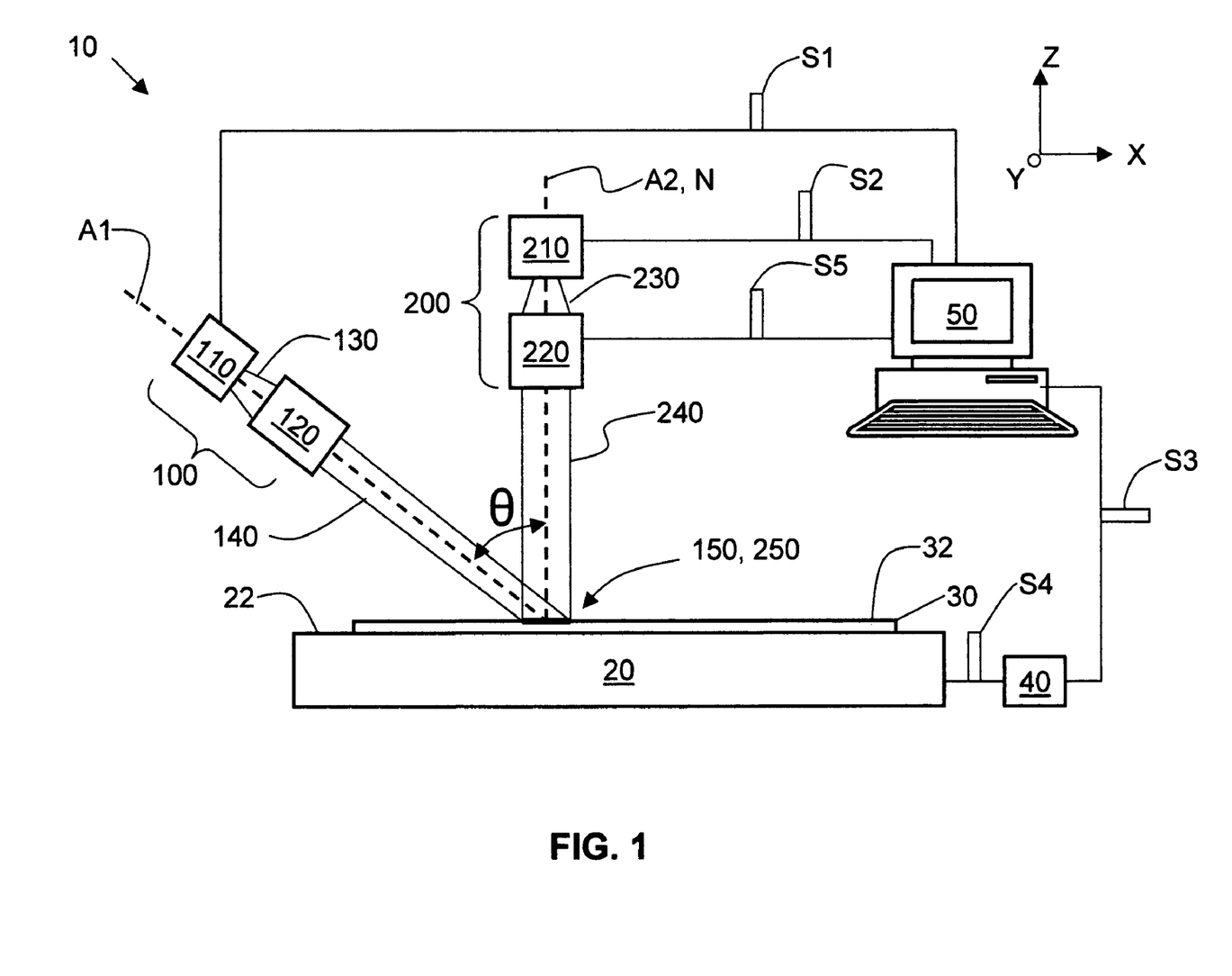
FIG. 1 is a schematic side view of an example embodiment of a thermal processing apparatus according to the present invention.

FIG. 1 is a schematic diagram of an example embodiment of a thermal processing apparatus 10 according to the present invention. LTP system 10 includes a movable substrate stage 20 having an upper surface 22 that supports a semiconductor substrate 30 having an upper surface 32. In an example embodiment, semiconductor substrate 30 is of the type that does not efficiently absorb infra-red (IR) annealing beam radiation, i.e. a substrate with an absorption length greater than 100 microns at the annealing beam wavelength. An example semiconductor substrate 30 is a lightly doped, or undoped silicon wafer used in semiconductor manufacturing. In other example embodiments, semiconductor substrate 30 is a heavily doped substrate, a substrate containing a mix of heavily and lightly doped regions, or a substrate that includes insulating regions or layers such as semiconductor-on-insulator (SOI) layers (e.g., an SOI wafer). The short-wavelength charge carrier activation beam can be employed across the board on both doped and undoped substrates, irrespective of their absorption characteristics at the annealing wavelength, since the low power activation beam is benign in any case.

It will be apparent to those skilled in the art that the present invention can be used to thermally process thermally transformable regions of a substrate over a wide range of temperatures. For example, the invention can be used for relatively low temperature thermal processing to form polysilicon and silicide layers. The invention can also be used at relatively high-temperature thermal processing associated with activating dopants formed near the substrate surface. Thus, for example, the present invention can be used to process substrates having an amorphous silicon layer that, upon annealing with the present invention at a temperature between 1000° C. and 1100° C. and with a dwell time of about 1 millisecond, is transformed to polysilicon. Likewise, the substrate may include a nickel or cobalt layer that is transformed by the present invention to a silicide layer. Substrate stage 20 is operably coupled to a stage driver 40, which in turn is operably coupled to controller 50. Substrate stage 20 is adapted to move in the X-Y plane (as well as along the Z-axis) under the operation of controller 50 and stage driver 40 so that the substrate can be scanned relative to the annealing and activating radiation beams, as discussed below.

LTP system 10 further includes an annealing radiation beam unit 100, which in an example embodiment includes, in order along an axis A1, an annealing radiation source 110 operably coupled to controller 50, and an annealing optical system 120. In an example embodiment, annealing radiation source 110 is a $CO_2$ laser that emits radiation at a wavelength $\lambda_{AN} \sim 10.6$ μm. Annealing radiation source 110 emits radiation 130 that is received by annealing optical system 120, which in turn forms an annealing radiation beam 140. Annealing radiation beam 140 travels along optical axis A1, which makes an angle θ with a substrate surface normal N.

Annealing radiation beam 140 forms an image 150 (hereinafter, the "annealing image") at substrate surface 32. In an example embodiment, image 150 is an elongate image, such as a line image, suitable for scanning over the substrate surface to perform thermal processing. Annealing image 150 is bounded by an outer edge 152 (FIGS. 3-6). To a first approximation, the temperature at substrate surface 32 is proportional to the integral of beam intensity under the annealing image profile in the scan direction. This integral changes along the length of the line image, so that at some point along the length of the image the temperature falls below the threshold temperature for annealing. Thus, there are boundaries along the line image, which define the extent of the line image where useful annealing occurs. The boundaries are where adjacent scans are butted together. In an example embodiment, the activating radiation (discussed below) is positioned so that a sufficient concentration of electrons and holes useful for absorbing the annealing beam is created in an area that extends over the narrow ends of the annealing beam boundaries by at a least a thermal diffusion distance, and on either side of the narrow annealing beam image so that where the annealing beam intensity is 5% or greater, it is efficiently absorbed near the substrate surface. This assures that nearly all of the annealing beam energy is efficiently utilized.

Apparatus 10 also includes an activating radiation beam unit 200, which in an example embodiment includes, in order along an axis A2, an activating radiation source 210 operably coupled to controller 50, and an activation optical system 220. In an example embodiment, activating radiation source 210 emits radiation at a wavelength that corresponds to an energy greater than the bandgap energy for semiconductor substrate 30, for the reasons explained below. In an example embodiment, activating radiation source 210 includes a semiconductor laser bar emitting radiation in the 800-830 nm spectral range. An example of such a laser bar is available from Spectra-Physics, Inc., Tucson Ariz. A 1 cm long bar is capable of emitting 50 Watts of continuous power. At this wavelength, the absorption length in undoped crystalline silicon is about 10 microns, which is about the depth required to effectively absorb the longer wavelength annealing radiation beam 140. Activating radiation source 210 emits radiation 230, which is received by activation optical system 220, which in turn forms an activating radiation beam 240. Activating radiation beam 240 travels along optical axis A2 and forms an image 250 (hereinafter, the "activating image") at substrate surface 32. Activating image 250 has an outer edge 252 (FIGS. 3-6) that, in an example embodiment, is defined by a threshold intensity value. In an example embodiment, activating radiation beam has a power between about 80 mW/cm² and about 8 W/cm².

Although in FIG. 1 the axis of the activating beam and the substrate normal are shown coincident, in an example embodiment, optical axis A2 is placed at an angle relative to surface normal N (i.e., at non-normal incidence) so that activating radiation that reflects from substrate surface 32 does not return to activating radiation source 210. Another reason for providing optical axis A2 at an incident angle, other than at normal incidence, is that efficiently coupling of activation radiation beam 240 into the substrate may best be accomplished by judicious choice of an incident angle, e.g., making the incident angle equal to the Brewster angle for the substrate.

Figure 2:
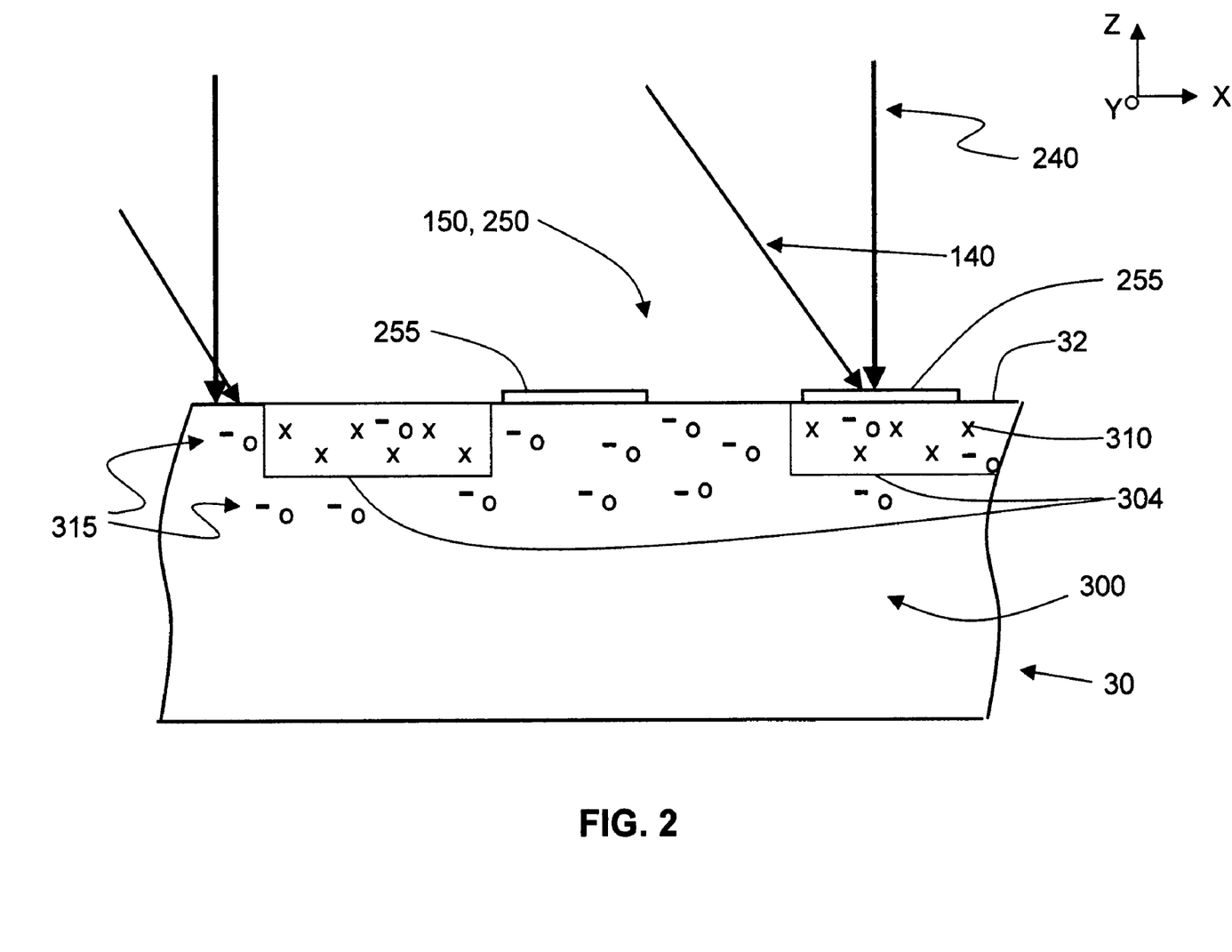
FIG. 2 is a close-up cross-sectional view of the semiconductor substrate of FIG. 1, illustrating doped regions formed at the substrate surface and circuit structures formed atop the substrate surface, as well as the overlap of the activating radiation beam and the annealing radiation beam at the substrate surface during thermal processing.

FIG. 2 is a close-up cross-sectional view of an example embodiment of substrate 30 along with annealing radiation beam 140 and activating radiation beam 240, whose respective images 150 and 250 lie close to each other and may overlap at substrate surface 32. It may be most advantageous to. completely overlap the activating and annealing images so that no shifting of the relative position of the two images is required when reversing the scanning direction. Also shown schematically in FIG. 2 are circuit patterns 255 residing atop substrate surface 32. Circuit patterns 255 may be, for example, a polysilicon conductor or gate electrode. In an example embodiment, substrate 30 is a lightly doped substrate 300 with very shallow heavily doped regions 304 formed therein that include dopants 310. Regions 304 are thermally transformable and may ultimately become, for example, the source and drain regions of a transistor. Free charge carriers 315, formed as discussed below, are also shown near substrate surface 32.

Figure 3:
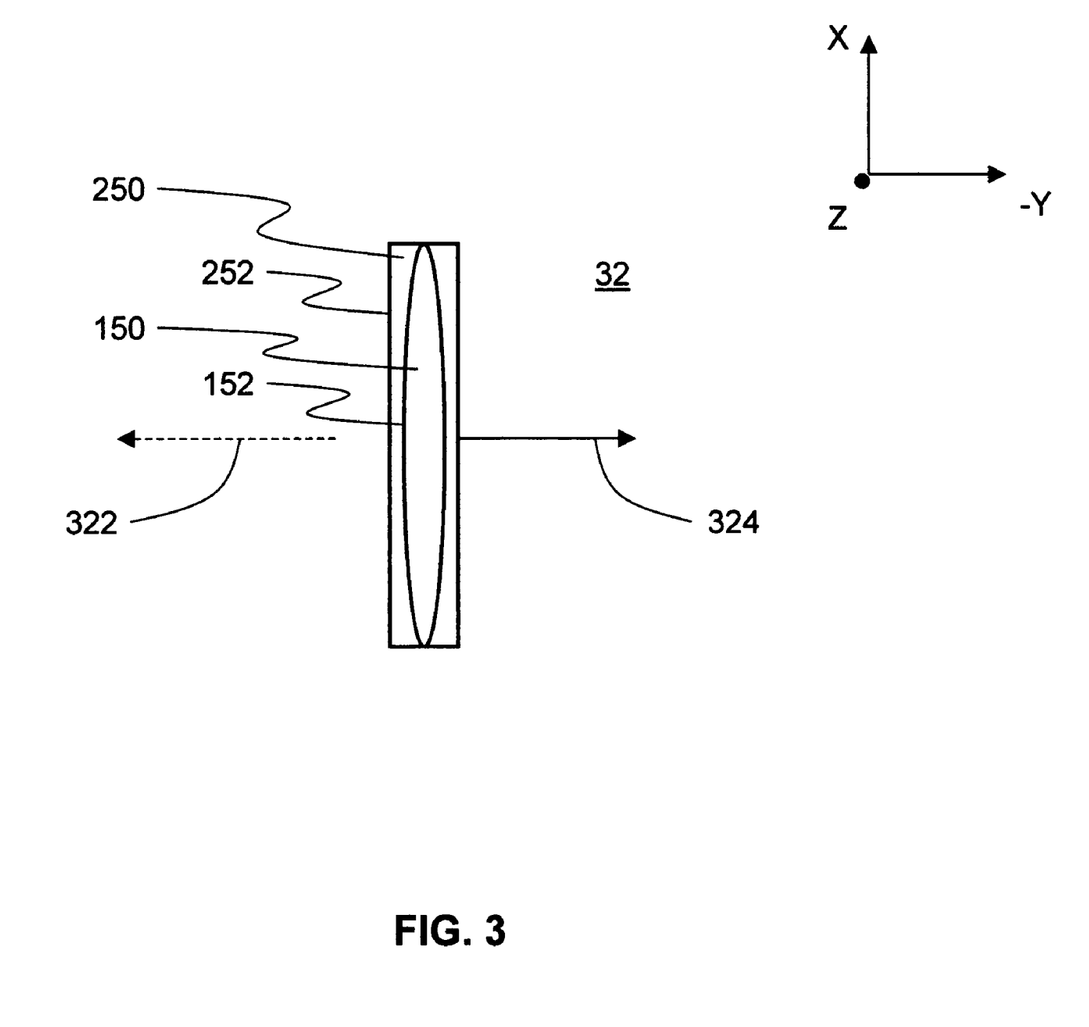
FIG. 3 is a plan view of the surface of the substrate of FIG. 1 as it is undergoing thermal processing, illustrating an example embodiment of the overlap of the annealing beam image and the activation beam image as formed at the substrate surface.

FIG. 3 is a close-up plan view of substrate surface 32 illustrating an example embodiment of the relative positions of annealing image 150 and activating image 250. In an example embodiment, annealing image 150 fits within activating image 250, although the image edge is not rigorously defined in either case.

The Role of the Activating Radiation Beam

The role of activating radiation beam 240 is to create sufficient free carriers 315 (FIG. 2) for annealing radiation beam 140 to be absorbed near the substrate surface. Note that doped regions (junctions) are too shallow to have any appreciable effect on the annealing radiation beam; their major effect is to alter the surface reflectivity. The absorption of the annealing radiation beam 140 is by free carriers 315, which may be generated by substrate doping, or heating, or by absorption of activating radiation beam 240. While IR-wavelength photons in annealing radiation beam 140 do not have sufficient energy to generate electron-hole pairs in silicon and most other semiconductors, visible or near-visible photons do. Activating radiation beam 240 therefore includes photons in the wavelength range that results in the formation of the free carriers 315 needed to provide absorption of the annealing radiation beam so that the substrate surface can be heated to a degree sufficient to anneal dopants 310 in doped regions 304.

In an example embodiment, it is also desirable that the free carriers generated by the activating beam be concentrated near the top surface, well within a thermal diffusion distance and preferably within a wavelength of the annealing beam. The thermal diffusion distance, δ, is defined as:

$$\delta = (\alpha \tau)^{0.5} \qquad \text{(Eq. 1)}$$

where α is the thermal diffusivity of the substrate material and τ is the dwell time, which is the time it takes for annealing image 140 to pass over a given point on substrate surface 32. The thermal diffusivity of silicon at room temperature is about 0.943 cm²/s. Thus, a one-millisecond dwell time yields a thermal diffusion distance δ~0.3 mm for a silicon wafer substrate.

The energy of the photons in activating radiation beam 240 is higher than the bandgap energy of the semiconductor substrate. In the case of silicon, the bandgap energy is 1.11 eV, which corresponds to a wavelength of ~1117 nm. Accordingly, in an example embodiment where semiconductor substrate 30 is silicon, activating radiation beam 240 has a wavelength of 1117 nm or shorter in order for it to create the necessary free carriers 315 to cause the annealing radiation to be absorbed by the silicon and heat the substrate to annealing temperatures.

When semiconductor substrate 30 is exposed to activating radiation beam 240, the generation of free carriers 315 begins immediately. At equilibrium the free-carrier generation rate equals the loss rate due to recombination, etc. The density of excess free carriers 315 approaches a level determined by the intensity of the activating radiation with an exponential time constant equal to the free-carrier lifetime τ in the semiconductor substrate. The free-carrier generation rate as a function of depth into the substrate depends on the intensity of the activating radiation beam at that depth. Generally, the intensity $I_A$ of the activating radiation beam and the resulting carrier generation rate decay exponentially with the depth z the substrate as:

$$I_A = I_0 e^{-kz} \quad \text{(Eq. 2)}$$

where $I_0$ is the radiation intensity at the surface and k is the absorption coefficient The parameter k may be adjusted by selecting an appropriate wavelength of radiation. In the case where annealing radiation beam 140 has a wavelength $\lambda_{AN}=10.6$ μm, it may be desirable for the semiconductor absorption to occur over a depth of approximately 10 μm as well. Thus, in an example embodiment, free carriers 315 are generated in a layer having a thickness (depth) substantially equal to the wavelength $\lambda_{AN}$ of the annealing radiation beam.

In an example embodiment where semiconductor substrate 30 is a silicon wafer, the absorption coefficient k is approximately 0.1/μm at room temperature for an activating radiation beam wavelength $\lambda_A \sim 800$ nm. Thus, this wavelength would generate free carriers 315 to about the same depth as the annealing wavelength $\lambda_{AN}=10.6$ μm.

The density of free carriers 315 required to provide sufficient annealing radiation absorption is estimated from the characteristic impedance of electromagnetic (EM) wave propagation in the substrate. In the case of a silicon substrate, this impedance is approximately 110 ohms. If the resistivity of the semiconductor is much lower than this, the annealing radiation beam will tend to be reflected from the substrate surface. If the resistivity of the substrate is much higher than this, the annealing radiation beam will be transmitted through a thickness of many wavelengths before being completely absorbed. There is a relatively wide range of material conductivity that will result in acceptable levels of absorption of the annealing radiation beam. However, the material conductivity value should ideally be centered in a range where the sheet resistance of a one-wavelength slice of material approximately equals the characteristic impedance of the material for EM wave propagation.

Thus, for an annealing radiation beam with a wavelength $\lambda_{AN}=10.6$ μm, the preferred average silicon conductivity ρ is approximately:

$$\rho = R_s \times \lambda_{AN} = (110 \text{ ohms/square})(10.6 \text{ μm}) = 0.116 \text{ ohm-cm} \quad \text{(Eq. 3)}$$

where $R_s$ is the sheet resistance. At an electron mobility of 1350 cm²/volt-sec and a hole mobility of 450 cm²/volt-sec, this sheet resistance corresponds to an excess hole-electron pair density of $\sim 3 \times 10^{16}/\text{cm}^3$, or a total of $\sim 3 \times 10^{13}$ excess hole-electron pairs per square centimeter of surface area.

The amount of activating radiation required to produce a steady state free-carrier density $N \sim 3 \times 10^{13}/\text{cm}^2$ depends on the free-carrier lifetime τ. If a relatively short free-carrier lifetime τ of 100 μs is conservatively assumed (starting wafers should be greater than 1 ms, but contamination of substrates during processing will lower that value), then the required carrier creation rate G is given by:

$$G = N/\tau = (3 \times 10^{13}/\text{cm}^2)/(10^{-4} \text{ s}) = 3 \times 10^{17} e^- \text{-hole pairs/s cm}^2 \quad \text{(Eq. 4)}$$

If it is assumed that activating radiation beam 240 has a wavelength $\lambda_A = 800$ nm with a corresponding activating radiation beam photon energy $E_\gamma = 1.55$ eV, and if a quantum efficiency of 60% is also assumed, then the power P required to sustain the required free-carrier generation rate G is given by the relation (Eq. 5, below):

$$P = (E_\gamma)(G) = (1.55 \text{ eV})(3 \times 10^{17}/\text{s-cm}^2)(1.6 \times 10^{-19} \text{ Joules/eV})/0.6 \sim 124 \text{ mW/cm}^2 \quad \text{(Eq. 5)}$$

This power is far less than that required to actually heat the silicon substrate to cause a similar density of thermally generated free carriers, which is the order of about 250 W/cm², assuming a 1 millisecond dwell time.

Method of Operation

In the operation of thermal processing apparatus 10, controller 50 sends a control signal S1 to annealing radiation source 110 to activate this radiation source. In response thereto, annealing radiation source 110 emits radiation 130 that is received by LTP optical system 120, which forms annealing radiation beam 140. Annealing radiation beam 140 then proceeds along axis A1 to substrate surface 32, where it forms an annealing image 150 (FIG. 3). Controller 50 also sends a control signal S2 to activating radiation source 210 to activate this radiation source. In response thereto, activating radiation source 210 emits radiation 230 that is received by activation optical system 220, which forms activating radiation beam 240. Activating radiation beam 240 then proceeds along axis A2 to substrate surface 32, where it forms an activating image 250 (FIG. 3). In an example embodiment, activating image 250 at least partially overlaps with annealing image 150.

Figure 4:
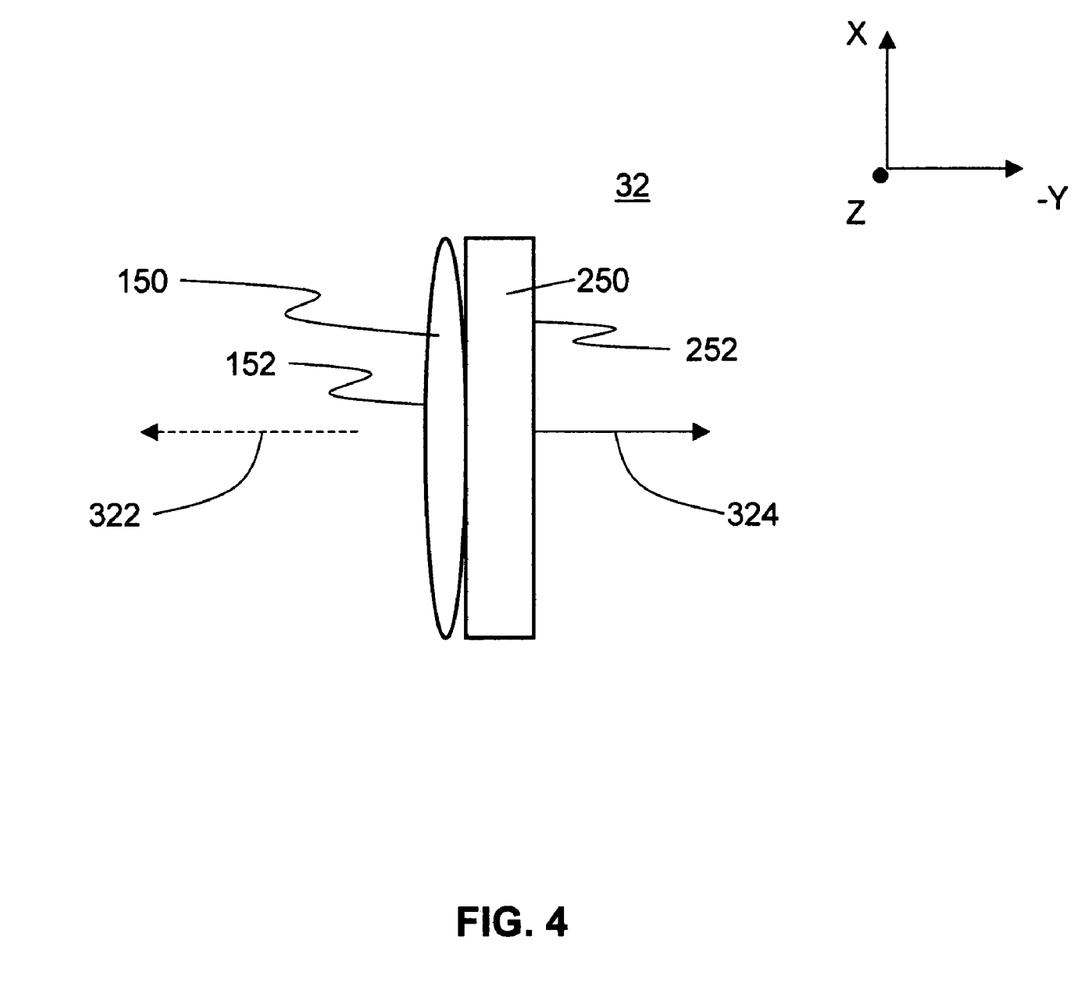
FIG. 4 is a plan view similar to FIG. 3, illustrating an example embodiment where the activation beam precedes the annealing beam image so that the two images do not overlap.

In another example embodiment illustrated in FIG. 4, activating image 250 immediately precedes annealing image 150. The amount of overlap Of the annealing and activating images (or the lack of overlap) depends on the dwell time and on the free-carrier lifetime τ. A conservative estimate of free-carrier lifetime τ is 100 μs. Semiconductor wafers should have a free-carrier lifetime τ greater than 1 ms, but contamination of substrates during processing tends to lower this value. If the free-carrier lifetime τ and the dwell times are both 1.0 ms, for example, then the activating image 250 could be butted against the annealing image 150, but not necessarily overlapped. Once the annealing image 150 has taken the substrate surface temperature up to 400° C., sufficient charge carriers are generated thermally to assure continued absorption of the annealing beam.

Controller 50 also activates stage driver 40 via a control signal S3. Stage driver 40, in turns, sends a drive signal S4 to stage 20 that causes the stage to move in the −Y-direction, as indicated by arrow 322 in FIGS. 3-6, so that annealing image 150 and activating image 250 are scanned over substrate surface 20 in the +Y direction (i.e., the scan direction), as indicated by arrow 324. As discussed above, activating radiation beam 240 causes the formation of the free carriers 315 (FIG. 2) needed to provide the necessary absorption of the annealing radiation beam so that the substrate surface can be heated to a degree sufficient to process substrate 30, e.g., anneal dopants 310 in doped regions 304. This is accomplished without substantially heating substrate 30 with the activating radiation beam.

Figure 5:
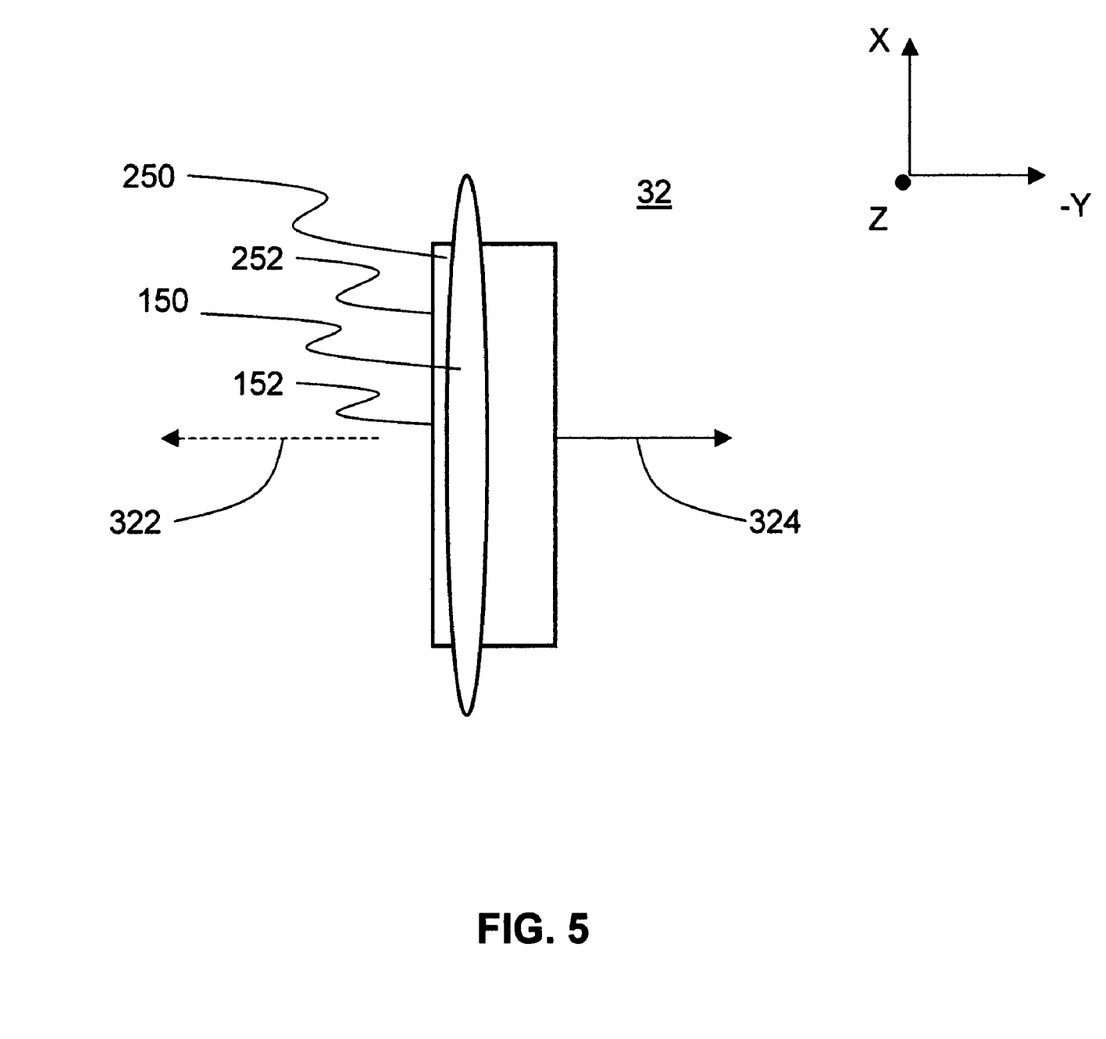
FIG. 5 is a plan view similar to FIG. 3, illustrating an example embodiment where the activation beam image extends forward in the scan direction relative to the annealing beam image and wherein the two images overlap.

Another example embodiment of an image geometry is illustrated in FIG. 5, wherein activating image 250 is formed so that it extends forward of annealing image 150 in a scan direction 324. This allows time for the concentration of the free carriers to approach equilibrium prior to the arrival of annealing image 150. In a variation of this example embodiment, the spatial extent of activation beam 250 in the +X and −X directions is limited to a particular portion of the line image in the long direction, for example, where the annealing beam intensity $I_s$ is 90% or greater than the maximum intensity. This geometry serves to sharpen the annealing image boundaries in the long direction, which can greatly assist in avoiding damage to the edge of the wafer by reducing annealing beam absorption in these regions.

Figure 6:
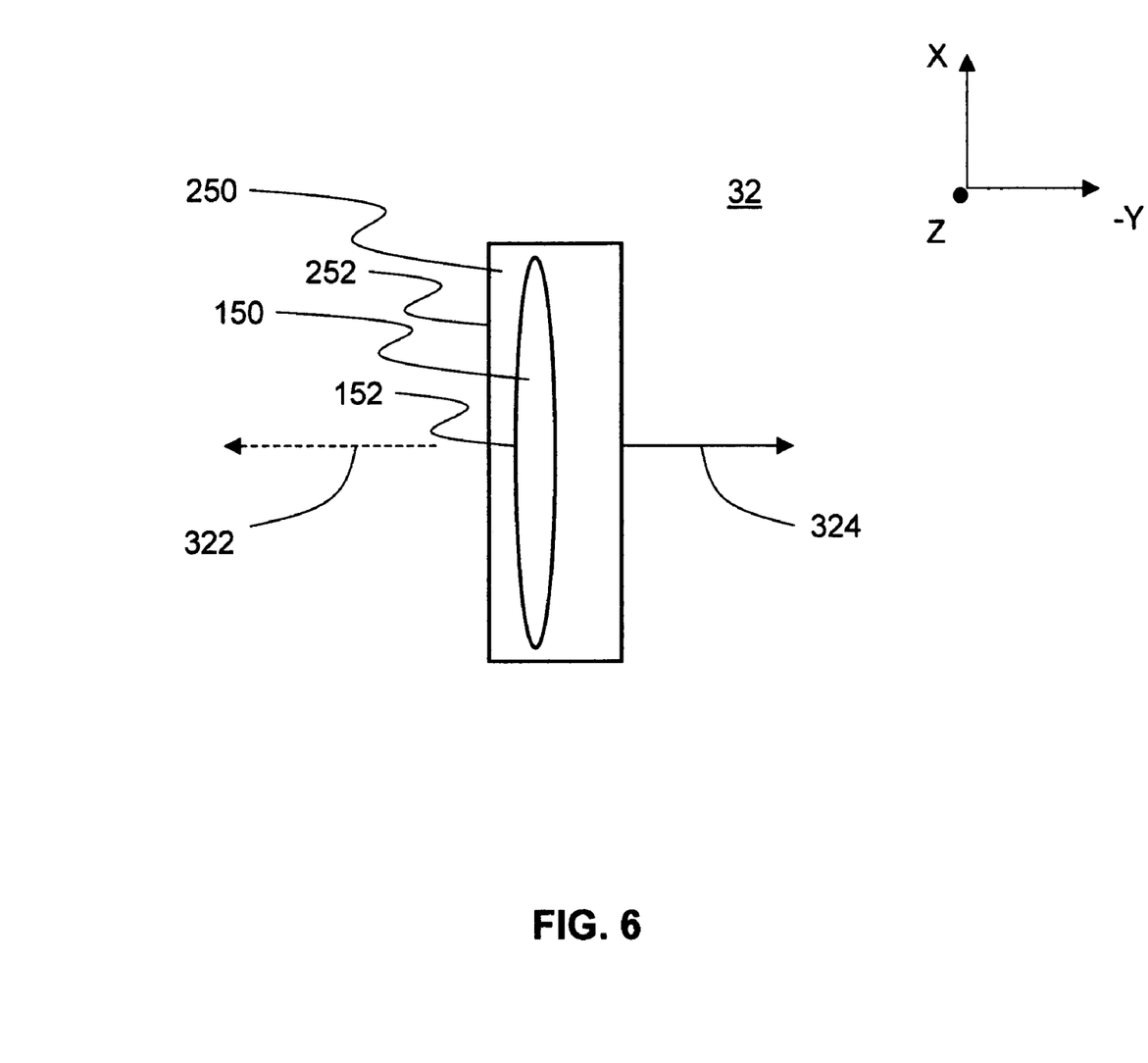
FIG. 6 is a plan view similar to FIGS. 3 and 5, illustrating an example embodiment where the activation beam image encompasses the entire annealing beam image.

Another example embodiment of an image geometry is illustrated in FIG. 6, activating image 250 is longer and wider than annealing image 150 along the X and Y directions, respectively. In this geometry, excess charge carriers are always present when annealing image 150 is incident on any particular location on substrate surface 32, provided the intensity of the charge generation beam is sufficient. This configuration might be useful where the accumulated dose from several overlapping scans determines the desired effect rather than the maximum temperature produced by any scan.

It should be noted that the optical power densities for the activating radiation beam 240 may exceed the levels discussed above depending on the nature of the semiconductor substrate 30 and the base temperature. Excess power in the activation beam may be highly desirable and can be employed so that point-to-point variations in the substrate characteristics or variations in the films on the wafer surface that define the transistor structures do not cause annealing temperature variations. In this case there is more than enough charge carriers to absorb the annealing beam within the thermal diffusion distance so small variations in the charge carrier distribution do not result in significant changes in annealing beam absorption or the resulting substrate surface temperature.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments and equivalents are within the scope of the appended claims.

What is claimed is:

1. A method of thermally processing a semiconductor substrate having a surface and a semiconductor bandgap energy, comprising the steps of:
   a. irradiating the substrate with an activating radiation beam having photons with an energy greater than the semiconductor bandgap energy to generate free carriers in the substrate without substantially heating the substrate, to increase an amount of absorption of an annealing radiation beam; and
   b. irradiating the substrate with the annealing radiation having photons with an energy less than the semiconductor band gap energy and which are absorbed by the free carriers to substantially heat the substrate.

2. The method of claim 1, wherein the annealing radiation beam has a wavelength of ~10.6 μm.

3. The method of claim 1, wherein the substrate is a silicon wafer and the activating radiation beam has a wavelength of 1117 nanometers or less.

4. The method of claim 3 further includes the step of:
   c. providing the activating radiation beam with a power between about 80 mW/cm$^2$ and about 8 W/cm$^2$.

5. The method of claim 1, wherein the activating radiation beam forms an activating image, the annealing radiation beam forms an annealing image, and wherein the annealing image at least partially overlaps with the activating image.

6. The method of claim 5, wherein the annealing image fits within the activating image.

7. The method of claim 1 further includes the step of:
   c. moving the substrate relative to the activating radiation beam and the annealing radiation beam to scan said beams over the substrate surface.

8. The method of claim 1, wherein the substrate is a semiconductor-on-insulator (SOI) wafer.

9. The method of claim 1 further includes the step of:
   c. heating the substrate to a temperature sufficient to activate dopants formed near the substrate surface.

10. The method of claim 1 further includes the step of:
    c. heating the substrate to a temperature sufficient to transform an amorphous silicon layer to a polysilicon layer.

11. The method of claim 1 further including the step of:
    c. heating the substrate to a temperature sufficient to transform a nickel or cobalt layer to a silicide layer.

12. A method of thermally processing a semiconductor substrate having a surface and a semiconductor bandgap energy to activate doped regions formed in the substrate at or near the substrate surface, comprising the steps of:
    a. irradiating the substrate surface with an activating radiation beam having a photon energy greater than the semiconductor bandgap energy to generate free carriers without substantially heating the substrate surface while increasing the absorption of an annealing radiation beam; and
    b. irradiating the substrate surface with the annealing radiation beam that at least partially overlaps the activating radiation beam at the substrate surface, the annealing radiation beam having a photon energy below said bandgap energy and which is absorbed by the free carriers to heat the substrate to a temperature sufficient to activate the doped regions.

13. The method of claim 12 further including the step of:
    c. scanning the first and second radiation beams over the substrate surface.

14. The method of claim 12, wherein the substrate is made of silicon and the first radiation beam has a wavelength of 1117 nanometers or less.

15. The method of claim 12, wherein the first radiation beam has a power between about 80 mW/cm$^2$ and about 8 W/cm$^2$.

16. An apparatus for thermally annealing an undoped or lightly doped semiconductor substrate having a surface, a region to be thermally transformed, and a semiconductor bandgap, comprising:
    an activating radiation beam unit adapted to form an activating radiation beam having a photon energy greater than the semiconductor bandgap energy to generate free carriers in the substrate without substantially heating the substrate to increase an amount of absorption of an annealing radiation beam near the top surface of the substrate; and an annealing radiation beam unit adapted to form an annealing radiation beam having a photon energy less than the semiconductor bandgap energy that is absorbed by the free carriers to heat the substrate to a temperature sufficient to thermally transform the region.

17. The apparatus of claim 16, wherein the region to be thermally transformed includes a doped region, and the substrate temperature is made sufficient to activate dopants in the doped region.

18. The apparatus of claim 16, wherein the region to be thermally transformed includes an amorphous silicon layer, and the substrate temperature is made sufficient to transform the amorphous silicon layer to polysilicon.

19. The apparatus of claim 16, wherein the region to be thermally transformed includes a nickel or cobalt layer, and the substrate temperature is made sufficient to transform the nickel or cobalt layer to a silicide layer.

20. The apparatus of claim 16, wherein the activating radiation beam unit and the annealing radiation beam unit are arranged to cause the activating radiation beam and the annealing radiation beam to at least partially overlap at the substrate surface.

21. The apparatus of claim 16, wherein the substrate is silicon and wherein:

the activating radiation beam has a wavelength of 1117 nm or less; and the annealing radiation beam has a wavelength of 1117 nm or greater.

22. The apparatus of claim 16, wherein the activating radiation beam unit provides the annealing radiation beam with a power of between about 80 mW/cm$^2$ and about 8 W/cm$^2$.

23. The apparatus of claim 16, further including a movable substrate stage that supports the semiconductor substrate and that is adapted to move the substrate relative to the first and second radiation beams to effectuate scanning of the first and second radiation beams over the substrate surface.

24. The apparatus of claim 16, wherein the first radiation beam unit includes:

a radiation source adapted to emit activating radiation; and an optical system adapted to receive the activating radiation and form therefrom the activating radiation beam that forms an activating image at the substrate surface;

wherein the optical system is adjustable to adjust a position of the activating beam relative to a position of the annealing beam.

* * * * *